United States Patent [19]

Ahlgren et al.

[11] Patent Number: 4,667,395

[45] Date of Patent: May 26, 1987

[54] METHOD FOR PASSIVATING AN UNDERCUT IN SEMICONDUCTOR DEVICE PREPARATION

[75] Inventors: David C. Ahlgren, Hopewell Junction; William H. Ma, Wappingers Falls; Martin Revitz, Poughkeepsie, all of N.Y.

[73] Assignee: International Business Machines Corporation, Armonk, N.Y.

[21] Appl. No.: 717,390

[22] Filed: Mar. 29, 1985

[51] Int. Cl.[4] .................. H01L 21/58; H01L 21/60
[52] U.S. Cl. ................................. 29/591; 29/576 B; 29/578; 29/589; 29/571
[58] Field of Search ............... 29/576 B, 578, 591, 29/589; 156/643, 650; 427/88, 93, 94

[56] References Cited

U.S. PATENT DOCUMENTS 3,906,620  10/1975  Angai et al. ................... 29/591
4,497,107  2/1985   Cogan .......................... 29/571
4,601,781  7/1986   Mercier et al. ................ 29/591

OTHER PUBLICATIONS

Antipav et al., "Reliable Passivation ... Diodes" IBM TDB vol. 25, No. 9, Feb. '83 pp. 4782-4784.
Jambotkar, C. "Method to Realize Submicrometer-Wide Images" IBM TDB vol. 25, No. 9, Feb. 83 pp. 4768-4772.
Ghondi, VLSI Fabrication Principles Silicon and Gallium Arsenide, John Wiley & Sons, New York, 1983, pp. 354, 355 and 427-429.

Primary Examiner—Brian E. Hearn
Assistant Examiner—Kevin McAndrews
Attorney, Agent, or Firm—Stanger, Michaelson and Einschlag

[57] ABSTRACT

A method, useful in fabricating semiconductor integrated circuits, for passivating an undercut formed by etch-back of a silicon dioxide layer under a diverse insulator film is disclosed. The method includes the step of coating the device with a thin, conformal film to a thickness sufficient only to line, without refilling, the lateral walls of the undercut region.

14 Claims, 4 Drawing Figures

METHOD FOR PASSIVATING AN UNDERCUT IN SEMICONDUCTOR DEVICE PREPARATION

BACKGROUND OF THE INVENTION

The present invention pertains to a method for passivating semiconductor device contacts and, in particular, for passivating nitride-defined Schottky diode contacts and shallow emitter contacts in silicon integrated circuit devices.

In recent years, silicon nitride masks have become a sought-after expedient in the fabrication of integrated circuits. Originally, the art taught that silicon nitride masking layers should be applied directly onto silicon substrates. However, the silicon nitride-silicon interface placed high stresses on the underlying silicon substrate. These stress often produce dislocations in the silicon substrate which resulted in undesirable leakage current, pipes and other adverse effects on the electrical characteristics of the interface. In order to minimize these stresses, the art next taught that a thin layer of silicon dioxide should be formed between the silicon substrate and the silicon nitride layer. This approach has been relatively successful where this composite layer is utilized for passivation.

Since metallic contact must be made with the semiconductor material underlying the protective dielectric layers, various openings or windows are cut in the layers, usually by an etching process. After an opening is formed through the outermost layer with one etchant, a second etchant is introduced through the opening to expose the underlying substrate. During the application of the second etchant, some lateral etching activity occurs that results in an overhanging ledge of the outermost film surrounding the entire opening or window. This over-hanging ledge can have undesirable effects on the resulting semiconductor articles.

For example, Schottky barrier diodes are often formed on silicon bodies having double-layer insulators, such as silicon dioxide coated with silicon nitride. Etching of the underlying silicon dioxide, through an opening in the silicon nitride, to define the diode area on the surface of the silicon body causes undercutting of the silicon nitride. Then, when a metal contact is deposited through the defined nitride area, a region of exposed silicon surface remains around the metallurgy and under the overhanging silicon nitride layer. This exposed silicon surface can lead to instability in the Schottky barrier diode during operation.

In another example, shallow emitter junctions are often formed in silicon bodies having double-layer insulators, such as silicon dioxide coated with silicon nitride. When the substrate is opened and the emitter is formed by ion implantation a problem arises with proper passivation of the emitter-base junction. This problem is caused because the ion implantation occurs in a direction normal to the substrate. The ions are masked by the nitride and do not reach the region of the substrate under the overhanging nitride layer. Therefore, since the passivating layer is undercut beneath the mask opening, the layer will not properly overlap the implanted emitter-base junction at the surface of the substrate. As a result, the emitter-base junction may not be properly passivated and the device yields are reduced.

A large amount of activity has occurred in the art aimed at solving these problems. For example, an article entitled "Process Modification For Improved Bipolar Circuit Performance" by C. G. Jambotkar, in *IBM Technical Disclosure Bulletin,* Vol. 24, No. 11A April 1982, pp. 5574–5577, recognizes the problem that arises in device fabrication when sequential silicon dioxide and silicon nitride layers are formed over a substrate and then opened up to expose the substrate, stating at p. 5577: "It is well-known that in a comparable standard process incorporating emitter implantation, the $SiO_2$ undercuts, which especially occur when wet $SiO_2$ etching is used, frequently create excessive emitter-base leakage because of the inadequate passivation of the emitter-base junction at the silicon surface—especially if the emitters are attempted to be made shallow." The article suggests a solution to this problem by means of a two-step process. First, the undercut region is filled by chemical vapor deposition (CVD) of about 500 angstroms of silicon dioxide and about 300–500 angstroms of silicon nitride. This is followed by the reatcive ion etch (RIE) removal of this composite layer everywhere except in the undercut, filling the sidewall regions.

In a further example, an article entitled "Reliable Passivation of Shallow Emitters As Well As Nitride-Defined Schottky Diodes" by I. Antipov and C. G. Jambotkar in *IBM Technical Disclosure Bulletin,* Vol. 25, No. 9 February 1983, pp. 4782–4784, discloses that in some standard bipolar technologies, when emitter and Schottky diode windows are formed in composite layers of silicon dioxide and silicon nitride, undercuts of the silicon nitride layer are created due to the undesired etching of silicon dioxide. This causes unreliability of the devices, leakages of Schottky diodes and/or emitter-base junctions. The article suggests a solution at p. 4784: "Without removing the screen oxide or, alternatively, after removal of the screen oxide and a thin re-oxidation, $Si_3N_4$ layer 12 is deposited to refill the undercut regions, . . . Through (vertically directional) RIE, $Si_3N_4$ layer 12 is removed excepting its portions filling the undercut regions."

In a further example, an article entitled "Method Of Producing Schottky Contacts", by M. Briska and A. Schmitt in *IBM Technical Disclosure Bulletin,* Vol. 22, No. 11 April, 1980, states on p. 4964: "This method concerns the production of Schottky contacts on a silicon semiconductor substrate, which are laterally limited by a silicon nitride layer. . . . The Schottky contacts are produced by applying to a suitably doped semiconductor substrate 1 a silicon dioxide layer 2 followed by a first silicon nitride layer 3. Contact hole 4 is etched first into layer 3 and then into layer 2. When layer 2 is etched, layer 3 is laterally underetched, so that layer 3 overlaps, . . . When the contacts are subsequently vapor deposited, hollow spaces, which cannot be contacted and often lead to increased leakage currents, are formed under the overlapping layer part." The article suggests the following solution at p. 4964: "To eliminate this problem, the first layer 3, which is removed after contact hole 4 has been opened in layer 2, is replaced by a second layer layer 5 . . . having the same thickness as layer 2 arranged underneath it. This second layer 5 is then etched down to layer 2 by reactive ion etching (RIE), maintaining a nitride ring 6 . . . on the periphery of the contact hole."

A similar method for making stable nitride-defined Schottky barrier diodes by eliminating the undercut cavity in the oxide layer beneath a nitride ring defining the Schottky contact is shown in U.S. Defensive publication T101,201. It discloses filling the cavity by CVD depositing oxide into the undercut oxide cavity beneath the ring. The CVD oxide is then reactively ion etched to remove it except along the vertical walls of the nitride ring and the oxide cavity.

These methods suffer a drawback due to stresses caused at the silicon substrate-dielectric layer interface. Generally, a silicon dioxide layer on a substrate induces a compressive stress on the substrate. On the other hand, a silicon nitride layer in contact with a substrate induces a tensile stress with respect to the same substrate. Furthermore, the tensile stress per unit surface area created by a conventionally deposited silicon nitride layer with respect to the substrate is on the order of approximately 10 times the compressive stress per unit area created by a silicon dioxide layer. Therefore, the methods in the art of refilling the undercut, and especially those which leave a substantial nitride-substrate interface, would cause stress and produce defects and leakage in the devices.

SUMMARY OF THE INVENTION

The method of the present invention solves the above-referenced problems which occur in the fabrication of semiconductor devices and, in particular, the problem of passivating nitride-defined Schottky diode contacts and shallow emitter contacts in silicon integrated circuit devices without stressing the substrate. Advantageously, by use of the method of the present invention, more stable, reliable and defect free devices can be fabricated.

According to the method of the present invention, a substrate layer lying under a first and a second layer is exposed, resulting in an undercutting of the second layer. This is followed by the step of depositing a thin, conformal third layer on the structure. In one embodiment of the present invention the third layer is silicon nitride which is deposited by, for example, low pressure chemical vapor deposition (LPCVD). This thin nitride film merely lines, without refilling, the sidewalls of the undercut. By merely lining the undercut region, the build up of stress in the substrate is avoided. At this point many various processing steps may take place, for example, removing the thin conformal film everywhere except where it lines the walls of the undercut by, for example, RIE.

The lower limit of the thickness of the thin silicon nitride layer is determined by the thickness required to form pin-hole free films, i.e. 50 to 100 angstroms. The upper limit of the thickness of the thin silicon nitride layer is determined by the requirement that the undercut not be filled and by the thickness at which stress induced defects are generated and electrical degradation occurs. In variations of the present invention, used in forming shallow emitters by ion implantation, the thin, conformal layer may be deposited directly over a thin silicon dioxide film having a thickness, for example, of 225 angstroms, and being referred to hereinafter as the emitter screen oxide layer.

An example of a method that appears to use a thin, conformal layer to line, but not fill an undercut region, for fabricating submicrometer-wide resistors and deep dielectric isolation walls is disclosed in an article entitled "Method To Realize Submicrometer-Wide Images" by C. G. Jambotkar in *IBM Technical Disclosure Bulletin*, Vol. 25, No. 9 February 1983, pp. 4768–4772. As described therein, a structure comprising a silicon wafer covered by layers of silicon dioxide and silicon nitride is wet etched to form undercuts in the silicon dioxide of any desired lateral depth of the order of 0.2–1.0 microns. Then, by CVD, a conformal layer of silicon nitride is formed which apparently coats, but does not fill, the undercut region. Then by directional RIE, the conformal layer of silicon nitride in the line-of-sight is etched away except where it coats the inner surfaces of the undercut. Then, after a thermal silicon dioxide layer is grown on the exposed substrate surface, all the silicon nitride, and thereby the undercut regions, are etched away. Thus, this method not only uses the conformal layer for a different purpose than in the inventive process, it is totally removed in the final product of the process.

BRIEF DESCRIPTION OF THE DRAWING

A complete understanding of the present invention may be gained by considering the following detailed description in conjunction with the accompanying drawing, in which.

To facilitate reader understanding, identical reference numerals are used to designate elements common to the figures.

DETAILED DESCRIPTION

For the purpose of illustration, the following embodiments will be described with reference to the fabrication of a transistor and a Schottky diode. Clearly, in an integrated circuit many such transistors and diodes, as well as other circuit elements, would also be formed, such circuit elements being located within isolation regions as desired with respect to particular circuit design considerations.

Figure 1:
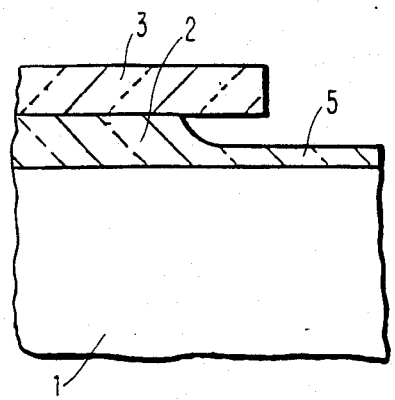
FIG. 1 shows, in pictorial form, a cross-section of a structure formed in preparation for ion implantation of an emitter-base junction through a screen oxide layer, as applied to the fabrication of an implanted emitter.

FIG. 1 shows a cross-section of a structure formed at one stage of the fabrication of an emitter-base junction in a transistor, for example a transistor located in an integrated circuit. Layer 1 is a silicon substrate. Then, layer 2, a silicon dioxide layer, in this embodiment having a thickness of approximately 1000 angstroms, and layer 3, a silicon nitride layer, were successively formed on the structure. An opening has been formed in layer 2 by, for example, RIE. An opening has been made in layer 3 by wet etching with, for example, 7:1 or 40:1 buffered hydrofluoric acid (BHF) to expose substrate 1 in preparation for the ion implantation of an emitter region in substrate 1. As a result of the wet etch, layer 3 has been laterally etched so that silicon nitride layer 3 overhangs substrate 1.

Layer 5, in this embodiment an approximately 225 angstrom screen oxide layer, has been grown over the opening in substrate 1, delineated by silicon nitride layer 3, in preparation for the step of ion implanting.

To this point, the processing steps are known in the art and further description thereof is not required.

Figure 2:
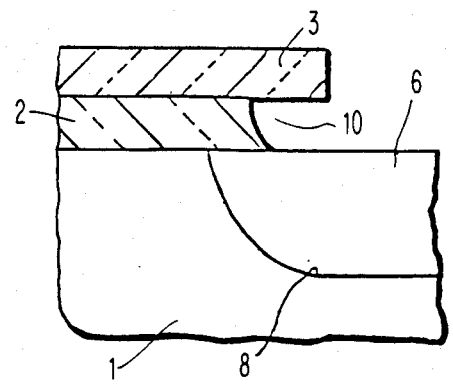
FIG. 2 shows, in pictorial form, a cross-section of the structure formed after the screen oxide layer shown in FIG. 1 is etched back to expose the surface of the substrate.

FIG. 2 illustrates the undercutting previously referred to hereinabove. The following steps have been applied to the structure shown in FIG. 1 to form the structure shown in FIG. 2: ion implantation with the appropriate ion to form an emitter region and thermal drive-in to produce emitter region 6 in substrate 1 having emitter-base junction 8; and wet etching with, for example, BHF to remove screen oxide layer 5 and expose substrate 1. The results, shown in FIG. 2, disclose a sustantial, 1000-2000 angstrom, undercutting of silicon nitride layer 3 in region 10. This, as has been discussed hereinabove, can cause an increase in emitter-base leakage and reduction in beta after metal layer conductor formation.

Figure 3:
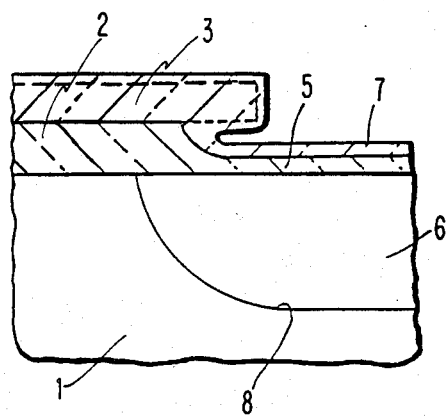
FIG. 3 shows, in pictorial form, a cross-section of the structure formed when a thin, conformal layer of silicon nitride has been formed on the structure shown in FIG. 1 in accordance with the method of the present invention.

The following steps, in accordance with the method of the present invention, have been applied to the structure shown in FIG. 1 to form the structure shown in FIG. 3: ion implantation with the appropriate ion to form an emitter region and thermal drive-in to produce emitter region 6 in substrate 1 having emitter-base junction 8; and depositing thin, conformal silicon nitride layer 7 on the structure by, for example, low pressure chemical vapor deposition (LPCVD).

As shown in FIG. 3, layer 7 is thin enough so that it does not fill the undercut region, but merely lines it. By merely lining the undercut region and leaving the undercut in place, the build up of stresses in the substrate is avoided.

The lower limit of the thickness of the thin silicon nitride layer is determined by the thickness required to form pin-hole free films, i.e. 50 to 100 angstroms. The upper limit of the thickness of the thin silicon nitride layer is determined by the requirement that the undercut not be filled and by the thickness at which stress induced defects are generated and electrical degradation occurs. In practice, the stress placed on the substrate depends on the thickness of layer 5 and the thickness of layer 7. In this embodiment, where layer 2 is approximately 1000 angstroms and layer 5 is approximately 225 angstroms, the upper limit of thickness of layer 7 is in the range of 300-400 angstroms. We have determined, as a result of fabricating semiconductor intergrated devices by means of the present invention, that a thickness of approximately 200 angstroms for silicon nitride layer 7 appears to give the best results for passivation and beta of the transistor.

Figure 4:
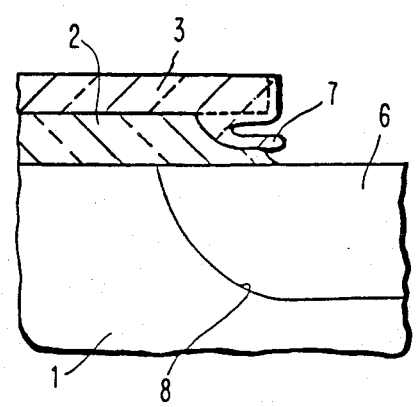
FIG. 4 shows, in pictorial form, a cross-section of the structure formed when the thin, conformal film of silicon nitride and the thin screen oxide layer shown in FIG. 3 have been removed to re-expose the substrate in accordance with the method of the present invention.

The following steps have been applied to the structure shown in FIG. 3 to form the structure shown in FIG. 4: removing thin layer 7 in the aperture over emitter region 6 defined by silicon nitride layers 3 and 7 by, for example, RIE; and removing screen oxide layer 5 to expose emitter region 6 in substrate 1 by, for example, wet etching with BHF (We prefer to wet etch screen oxide layer 5 rather than using RIE because RIE appears to damage the exposed surface of substrate 1 in some instances).

To complete the emitter formation, an emitter contact can be formed on substrate 1 at emitter region 6 by, for example, evaporating platinum, sintering and etching.

It should be clear to those skilled in the art that the method of the present invention may be adapted to the fabrication of nitride-defined Schottky diodes as well as many other devices. For example, a nitride-defined Schottky diode may be fabricated in an integrated circuit by the following steps: forming a silicon dioxide layer on a substrate; forming a silicon nitride layer on the silicon dioxide layer; opening the silicon nitride layer by, for example, RIE; exposing the substrate by, for example, wet etching to produce an undercut, like region 10 shown in FIG. 2; depositing a thin, conformal layer of silicon nitride by, for example, LPCVD on the structure which lines, but does not fill the undercut, to form a structure analogous to that shown in FIG. 3; opening the thin, conformal layer of silicon nitride by, for example, RIE to expose the substrate in a region delineated by the silicon nitride layers; and depositing a Schottky contact on the exposed portion of the substrate.

It should be clear to those skilled in the art that the steps described hereinabove of wet etching, reactive ion etching, chemical vapor deposition, ion implantation, thermal drive-in and so forth with respect to silicon, silicon nitride and silicon dioxide are known in the art.

Clearly, those skilled in the art recognize that further embodiments of the present invention may be made without departing from the teachings of the present invention.

What is claimed is:

1. In a method for forming semiconductor devices an or in a semiconductor substrate, the improvement comprising:
    sequentially forming a plurality of diverse layers which comprises sequentially a layer of silicon dioxide and a layer of silicon nitride covering an area of a semiconductor substrate,
    opening the layers to expose a portion of the surface of the substrate with concurrent formation of a cavity between the surface and a top one of the layers,
    forming a thin conformal film of a passivating material comprising silicon nitride on the surfaces of the cavity,
    opening the conformal film to re-expose the portion of the surface of the substrate,
    forming a metal contact on the re-exposed surface.

2. The method claimed in accordance with claim 1 wherein the thickness of the conformal silicon nitride film has a lower limit between 50 and 100 angstroms and an upper limit determined by the requirement that the cavity remain unfilled.

3. In a method for forming semiconductor devices on or in a semiconductor substrate, the improvement comprising:
    sequentially forming a plurality of diverse layers covering an area of a semiconductor substrate,
    opening the layers to expose a portion of the surface of the substrate with concurrent formation of a cavity between the surface and a top one of the layers,
    forming a thin film over the exposed portion of the substrate,
    forming a thin, conformal film of a passivating material on the surfaces of the cavity,
    opening the conformal film and the thin film to re-expose the surface portion,
    forming a further thin film over the re-exposed surface portion, and
    ion implanting to form a doped region in the substrate.

4. The method claimed in accordance with claim 3 wherein the layers comprise sequentially a layer of silicon dioxide and a layer of silicon nitride, the thin film and the further thin film comprise silicon dioxide, and the passivating material comprises silicon nitride.

5. The method claimed in accordance with claim 4 wherein the thickness of the the conformal silicon nitride film has a lower limit between 50 to 100 angstroms and an upper limit determined by the requirement that the cavity remain unfilled.

6. In a method for forming semiconductor devices on or in a semiconductor substrate, the improvement comprising:
sequentially forming a plurality of diverse layers covering an area of a semiconductor substrate,
opening the layers to expose a portion of the surface of the substrate with concurrent formation of a cavity between the surface and a top one of the layers,
forming a thin film over the exposed surface portion,
ion implanting to form a doped region in the substrate,
forming a thin, conformal film of a passivating material on the surfaces of the cavity, and
forming an opening through the conformal film and the thin film to re-expose the surface portion.

7. The method claimed in accordance with claim 6 wherein the layers comprise sequentially a layer of silicon dioxide and a layer of silicon nitride, the thin film comprises silicon dioxide, and the passivating material comprises silicon nitride.

8. The method claimed in accordance with claim 7 wherein the thickness of the the conformal silicon nitride film has a lower limit between 50 to 100 angstroms and an upper limit determined by the requirement that the cavity remain unfilled.

9. In a method for forming semiconductor devices on or in a semiconductor substrate, the improvement comprising:
sequentially forming a plurality of diverse layers covering an area of a semiconductor substrate,
opening the layers to expose a portion of the surface of the substrate with concurrent formation of a cavity between the surface and a top one of the layers,
forming a thin film over the exposed surface portion,
ion implanting to form a doped region in the substrate,
opening the thin film to re-expose the surface portion,
forming a further thin film over the exposed portion of the substrate,
forming a thin, conformal film of a passivating material on the surfaces of the cavity, and
opening the conformal film and the further thin film to re-expose the surface portion.

10. The method claimed in accordance with claim 9 wherein the layers comprise sequentially a layer of silicon dioxide and a layer of silicon nitride, the thin film and the further thin film comprise silicon dioxide, and the passivating material comprises silicon nitride.

11. The method claimed in accordance with claim 10 wherein the thickness of the the conformal silicon nitride film has a lower limit between 50 to 100 angstroms and an upper limit determined by the requirement that the cavity remain unfilled.

12. In a method for forming semiconductor devices on or in a semiconductor substrate, the improvement comprising:
sequentially forming a plurality of diverse layers covering an area of a semiconductor substrate,
opening the layers to expose a portion of the surface of the substrate with concurrent formation of a cavity between the surface and a top one of the layers,
forming a thin film over the exposed portion of the substrate,
forming a thin, conformal film of a passivating material on the surfaces of the cavity,
opening the conformal film and the thin film to re-expose the portion of the surface of the substrate, and
forming a metal contact on the re-exposed surface.

13. The method claimed in accordance with claim 12 wherein the layers comprise sequentially a layer of silicon dioxide and a layer of silicon nitride, the thin film comprises silicon dioxide, and the passivating material comprises silicon nitride.

14. The method claimed in accordance with claim 13 wherein the thickness of the the conformal silicon nitride film has a lower limit between 50 to 100 angstroms and an upper limit determined by the requirement that the cavity remain unfilled.

* * * * *

UNITED STATES PATENT AND TRADEMARK OFFICE
CERTIFICATE OF CORRECTION

PATENT NO. : 4,667,395

DATED : May 26, 1987

INVENTOR(S) : David C. Ahlgren, et al

It is certified that error appears in the above-identified patent and that said Letters Patent is hereby corrected as shown below:

IN THE CLAIMS:

Column 6, line 26, correct "an" to --on--.

Signed and Sealed this

Fifth Day of January, 1988

Attest:

DONALD J. QUIGG

Attesting Officer

Commissioner of Patents and Trademarks